United States Patent
Nonaka

(10) Patent No.: US 6,751,568 B2
(45) Date of Patent: Jun. 15, 2004

(54) METHOD FOR TESTING CHARACTERISTICS OF OSCILLATORS

(75) Inventor: Satoshi Nonaka, Hamamatsu (JP)

(73) Assignee: Humo Laboratory, Ltd., Tokyo (JP)

( * ) Notice: Subject to any disclaimer, the term of this patent is extended or adjusted under 35 U.S.C. 154(b) by 63 days.

(21) Appl. No.: 10/137,433

(22) Filed: May 3, 2002

(65) Prior Publication Data

US 2003/0171888 A1 Sep. 11, 2003

(30) Foreign Application Priority Data

Mar. 5, 2002 (JP) .......................... 2002-058791

(51) Int. Cl.[7] ................................................ G06F 3/05
(52) U.S. Cl. .................... 702/117; 702/54; 702/118; 702/124
(58) Field of Search .................... 702/40, 54, 117, 702/118, 124, 30, 64, 75, 79, 116, 120, 122; 427/402; 313/310; 600/405; 331/16

(56) References Cited

U.S. PATENT DOCUMENTS 5,719,782 A * 2/1998 Mitsuoka .................... 364/484
6,081,164 A * 6/2000 Shigemori et al. ............. 331/16
6,383,047 B1 * 5/2002 Minami et al. ................. 445/6

* cited by examiner

Primary Examiner—Marc S. Hoff
Assistant Examiner—Felix E Suarez
(74) Attorney, Agent, or Firm—Venable LLP; Chad C. Anderson; Michael A. Sartori

(57) ABSTRACT

The invention provides a method for testing oscillators in which cracks and chips on oscillator chips that may possibly have an effect on the oscillation characteristics can be detected efficiently, without using an optical examination device and an image processing device, which require troublesome adjustment and higher cost. When testing the oscillation characteristics of oscillator chips, the method comprises a network analyzer, an upper electrode, a lower electrode, an oscillator chip, a bush, and a personal computer. The personal computer is connected to the network analyzer using a GP-IB interface cable, and is capable of storing, displaying, and comparing all measurement results of the network analyzer. The upper electrode can be shifted vertically by a vertical mechanism. The oscillator chip is placed inside the bush, and it is possible to shift the oscillator chip to beneath the upper electrode, on to a conforming-item area, or to a nonconforming-item area by shifting the bush by means of a horizontal transfer mechanism.

5 Claims, 16 Drawing Sheets

METHOD FOR TESTING CHARACTERISTICS OF OSCILLATORS

BACKGROUND OF THE INVENTION

1. Field of the Invention

The present invention relates to a method for testing oscillation characteristics of quartz oscillators, ceramic oscillators, or the like.

2. Description of the Related Art

Quartz oscillators or ceramic oscillators are generally manufactured as follows:

First, a quartz chip or a ceramic chip (hereinafter referred to as "oscillator chip") is cut off from a crystal, fired or similarly treated, and is then polished to have an outline and thickness of predetermined dimensions. Following this, metal is evaporated on the oscillator chip, thereby forming an electrode. The oscillation frequency of the oscillator is finely adjusted by adjusting the evaporation level, and then it is completed by being housed in a predetermined package.

If there is a crack, chip, flaw, or the like on an oscillator chip that has not yet had metal evaporated thereon, there is a possibility that the crystal impedance may vary abnormally, or the frequency may fluctuate, when changing the electrical power applied to the completed oscillator.

Also, if the evaporation level is increased when performing metal evaporation in order to perform wide frequency adjustment, the evaporation time will be increased, resulting lower productivity. Moreover, there is a possibility of the crystal impedance rising abnormally, and there is a risk of deterioration over time due to peeling of the evaporated metal.

Thus, oscillators are examined by visual observation or optical examination methods in order to detect cracks, chips, flaws, or the like on the oscillator chips.

Also, it is a widespread practice that oscillator chips that have not yet had metal evaporated thereon are inserted between parallel opposing electrodes, i.e. a plurality of electrodes that are arranged opposite each other, and a CI meter, a network analyzer, etc. is connected to the oppositely arranged electrodes with parallel flat plates, and then the oscillation characteristics (oscillation frequency, crystal impedance, etc.) are measured to sort the oscillator chips.

As described above, it is necessary to perform an optical flaw detection examination and to measure electrically the oscillation characteristics in order to produce oscillators whose crystal impedance is low, which do not vary abnormally, and which have high frequency stability, even if the applied electrical power is changed.

In order to cope with such requirements, there are cases in which visual examination of oscillator chips is performed. However, since this is performed by people, the possibility that errors may occur must be considered, and hence visual examination alone will not lead to a complete solution of the problem.

Among inventions that have been proposed in order to solve this problem, Japanese Unexamined Patent Application Publication No. 2001-183310 entitled "Method For Examining Quartz Substrates and Device Thereof" is known. This invention features a combination of an optical examination device and an electrical examination device, which enables both the aforementioned optical examination and electrical examination to be performed by a single unit. However, much trial and error is necessary to adjust the illumination and the optical system and to set the threshold of an image processing device in order to adjust the optical system or the image processing device so as to allow simple contaminations, which have no effect on characteristics, to be distinguished from flaws or chips. Moreover, there is a fine difference in setting depending on the equipment, and thus it is not easy to use the device perfectly. In addition, because the optical examination device includes cameras, optical systems, and image processing devices, which are expensive, it is not economical to provide these devices on all manufacturing lines.

SUMMARY OF THE INVENTION

The present invention contributes to solving the foregoing problem, and the object of the invention is to provide a method for testing characteristics of oscillators only by electrical examination without using optical systems and image processing devices, which are expensive and complex to set, in order to obtain oscillators whose crystal impedance will not increase abnormally, nor whose frequency will vary, even if the electrical power applied to the oscillators changes.

In order to achieve the above objects, a method for testing characteristics of oscillators according to the present invention comprises a signal source designed for variable frequency and output amplitude; an electrode for applying an output signal of the signal source to an oscillator; measurement means for measuring an electrical current that flows through the oscillator via the electrode, or a level of the signal passing through the oscillator; and memory means for storing the results from the measurement means, wherein signals with the same frequencies but different output amplitudes are applied a plurality of times from the signal source to the oscillator, and after the corresponding outputs of the measurement means have been stored in the memory means, it is determined whether the oscillator is conforming or nonconforming by comparing the outputs of the measurement means at the same frequencies for different output amplitudes.

In the method for testing characteristics of oscillators according to the present invention, a network analyzer comprises the signal source or the measurement means.

DESCRIPTION OF THE PREFERRED EMBODIMENTS

The preferred embodiments of the invention will be explained in more detail below, with reference to the drawings.

Figure 1:
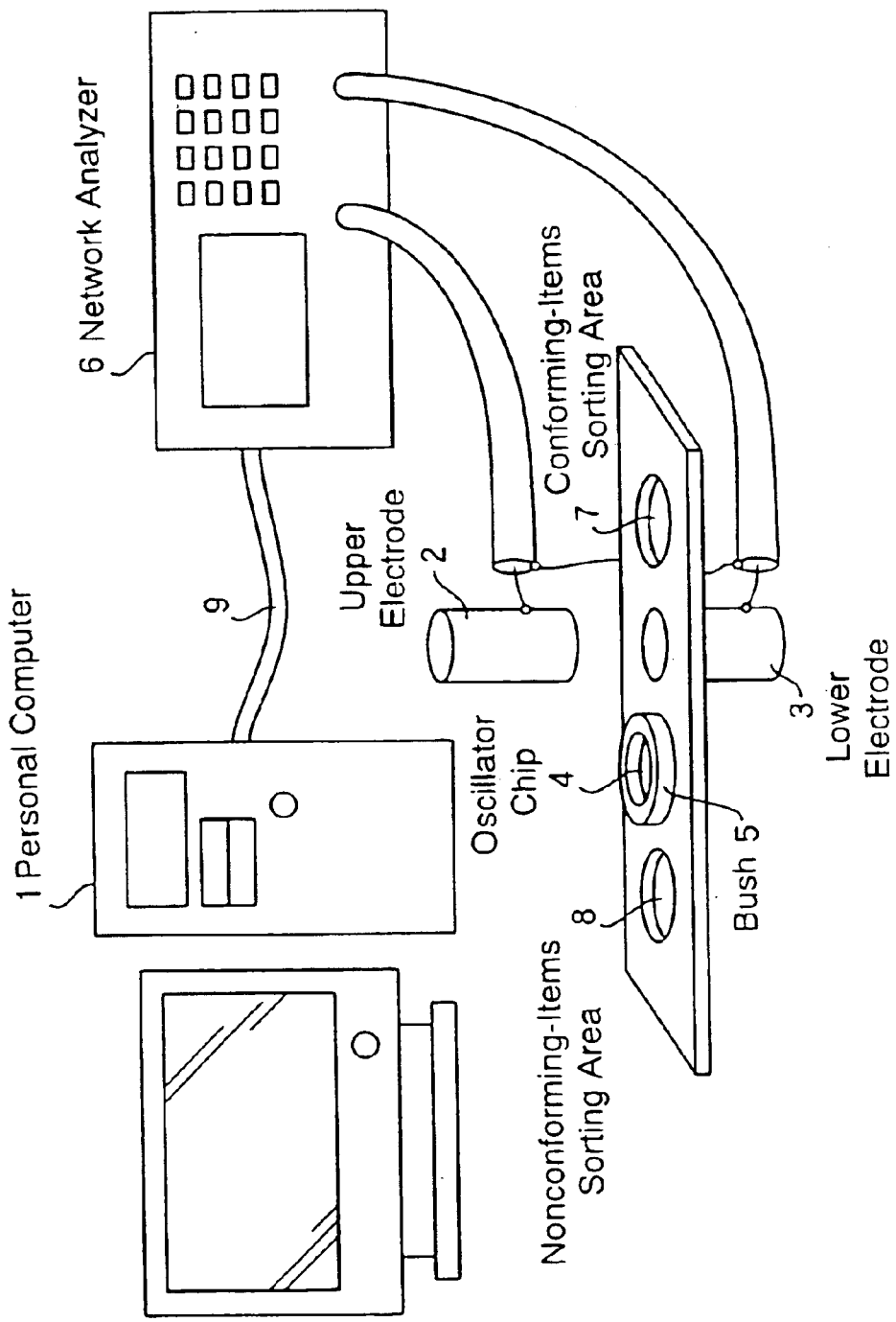
FIG. 1 is a schematic illustration showing a device that uses a method for testing characteristics of oscillators according to an embodiment of the present invention.

FIG. 1 is a perspective view that shows an embodiment of a method for testing characteristics of oscillators according to the present invention. FIG. 2 is a diagram that explains its operation.

The device comprises a network analyzer 6, an upper electrode 2, a lower electrode 3, an oscillator chip 4, a bush 5, and a personal computer 1. The personal computer 1 is connected to the network analyzer 6 using a GP-IB interface cable 9, and the measurement results of the network analyzer 6 can all be stored in memory, displayed, and compared.

The upper electrode 2 can be moved vertically by means of a vertical movement mechanism, which is not shown. Also, the oscillator chip 4 is placed within the bush 5, and the bush 5 is shifted by means of a horizontal shifting mechanism, which is not shown; thereby the oscillator chip can be shifted below the upper electrode 2, or to a conforming-items sorting area 7, or to a nonconforming-items sorting area 8.

Figure 2A:
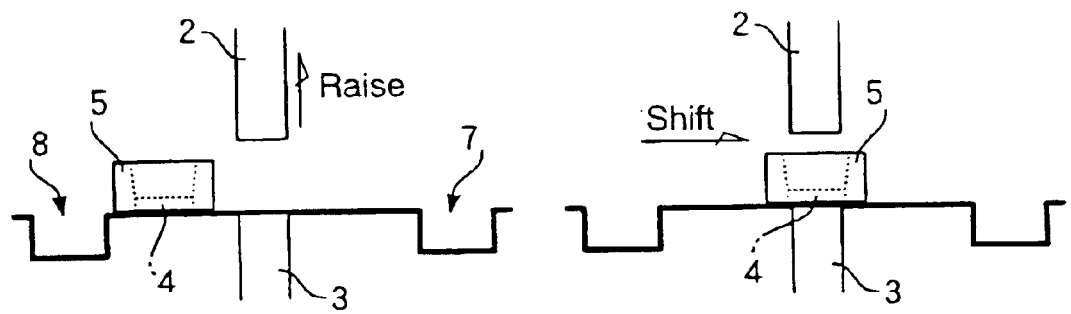
FIGS. 2A to 2E are diagrams illustrating the operation of FIG. 1.

In the present embodiment, an oscillation test is carried out with the following operating sequence:

First, the upper electrode 2 is raised to open a spacing sufficiently larger than the thickness of the bush 5 between the upper electrode 2 and the lower electrode 3 (FIG. 2A).

Figure 2B:
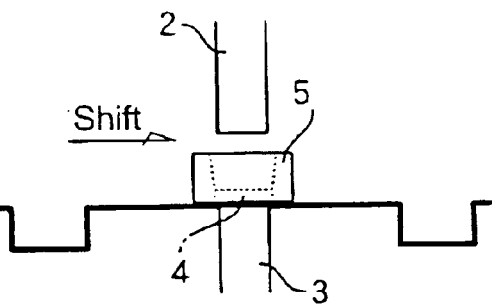

Next, the bush 5 moves into the spacing and stops when the oscillator chip to be measured comes to a position directly below the upper electrode 2 (FIG. 2B).

Following this, the upper electrode 2 is lowered until the spacing from/to the lower electrode 3 reaches a predetermined value.

Figure 2C:
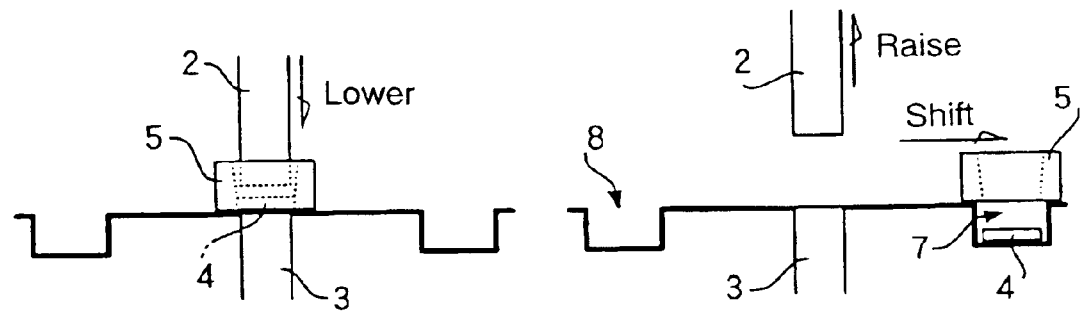

Under this condition, oscillation characteristics are measured with the network analyzer 6, as described below (FIG. 2C). The spacing between the electrodes when measuring oscillation characteristics is a value that was specified beforehand based on experiment so as to be optimal for measuring the oscillation characteristics.

First, after setting the electrical power of the network analyzer 6 at a predetermined output level (for example, −5 dBm), a sweep is performed over a range close to the resonance frequency of the oscillator chip 4.

Following this, measurement results of the network analyzer 6 at each sweep point are grabbed into the personal computer 1 and all points are stored in memory. Here, the sweep starting frequency, the end frequency, and the number of measured points within the sweep are the predetermined values that are specified in advance based on experiment or experience so as to be optimal for the resonance frequency of the oscillator chip.

Following this, the output power of the network analyzer 6 is increased (for example, it is set at 0 dBm) and the above-mentioned measurement is repeated.

Further, the output power of the network analyzer 6 is increased (for example, it is set at +5 dBm) and the above-mentioned measurement is repeated.

Further, the above-mentioned measurement is repeated with increased output power of the network analyzer 6 (for example, +10 dBm).

Figure 2D:
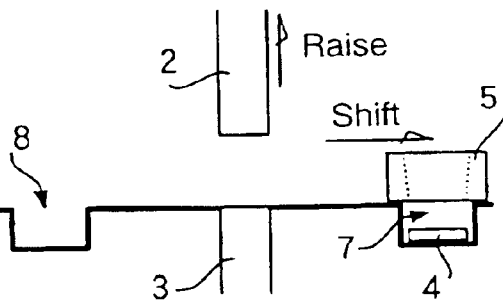

Subsequently, the measurement results of the 1st, 2nd, 3rd, and 4th sweeps that were grabbed into the personal computer 1 are compared. At this time, the measurement results of the oscillator chips at the same frequencies for each sweep are compared, and if the differences are within a predetermined threshold, the oscillator chips are determined to good enough that the oscillation characteristics will not vary with the applied electrical power. The bush 5 is shifted so as to sort them to the conforming-items area 7, after raising the upper electrode 2 (FIG. 2D).

Figure 2E:
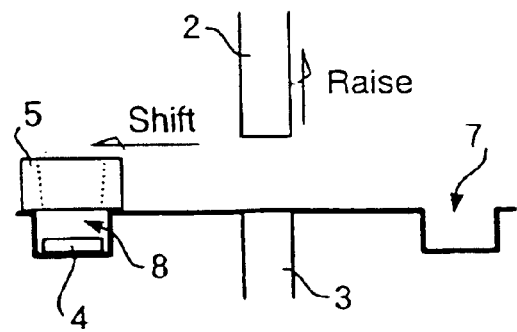

In each sweep, if the measurement difference for the same frequencies is larger than the predetermined threshold, it is determined that oscillation characteristics vary with changes in the applied power. Accordingly, the bush 5 is shifted so as to sort them to the nonconforming-items area 8, after raising the upper electrode 2 (FIG. 2E).

FIGS. 3 to 9 are examples of measurements in which the results of the measurements that are repeated four times, as described above, are summarized in one figure. For each waveform, the abscissa indicates frequency and the ordinate indicates the measured value. They are shown in the order: upper left (−5 dBm), upper right (0 dBm), lower left (+5 dBm), and lower right (+10 dBm).

Figure 3:
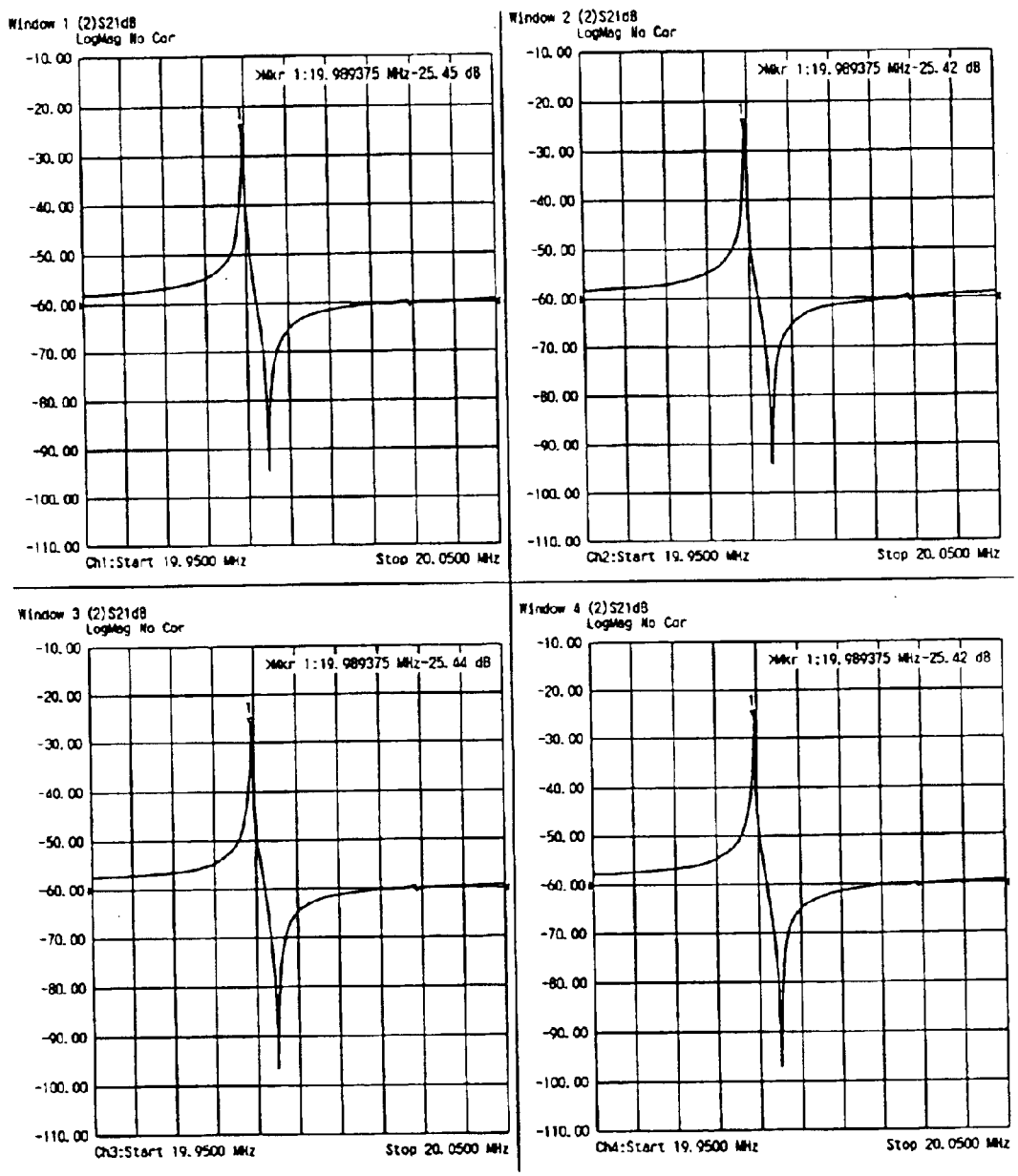
FIG. 3 is a waveform diagram illustrating a first example of measurement results that were obtained by a method for testing characteristics of oscillators according to the present invention.

In FIG. 3 (Data Sheet No. 23), the four graphs exhibit substantially similar shapes, and therefore the oscillator chips are judged to be conforming items based on the fact that the measurement results at the same frequencies in each measurement are nearly same.

Figure 4:
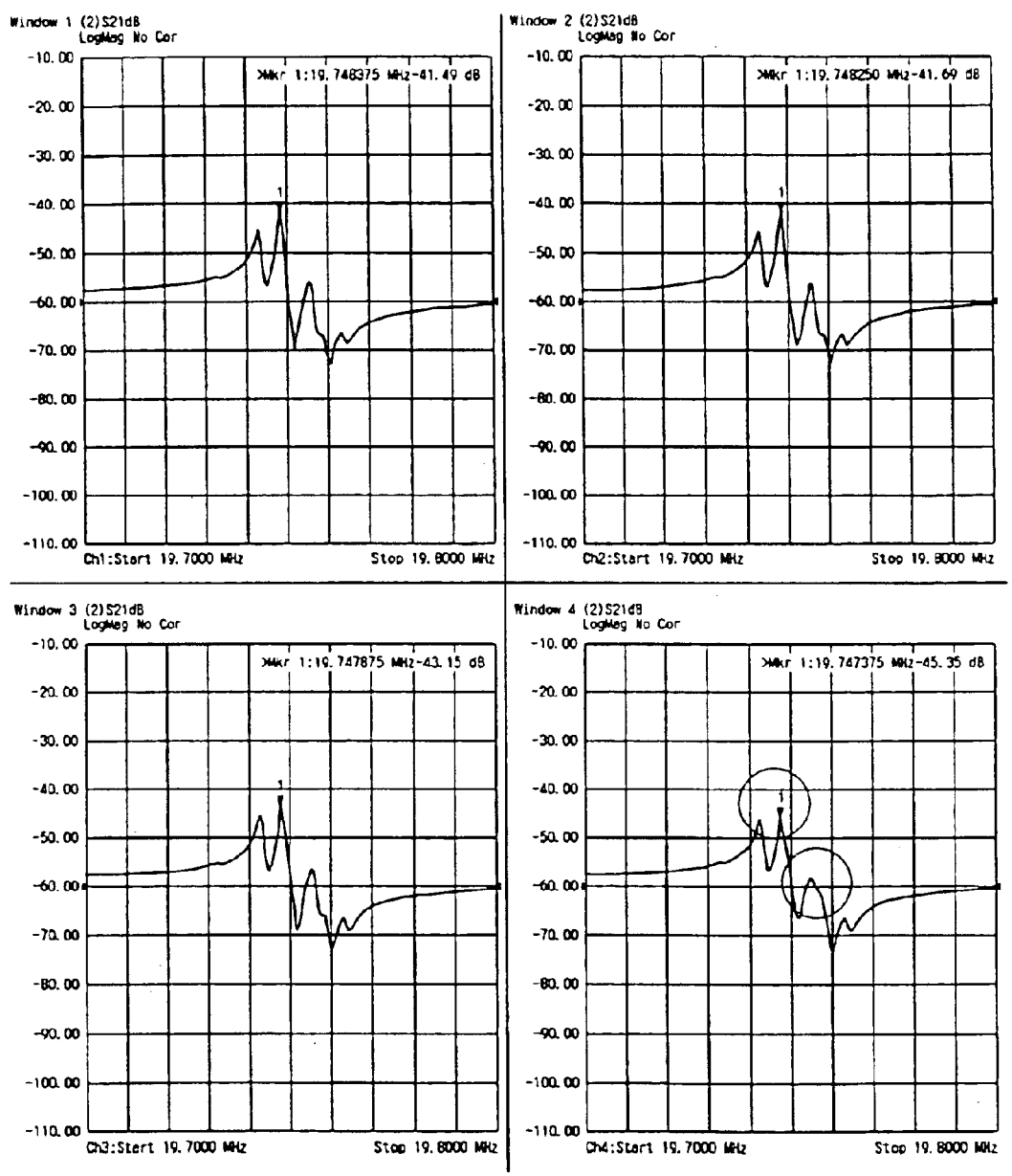
FIG. 4 is a waveform diagram illustrating a second example of measurement results that were obtained by a method for testing characteristics of oscillators according to the present invention.
Figure 5:
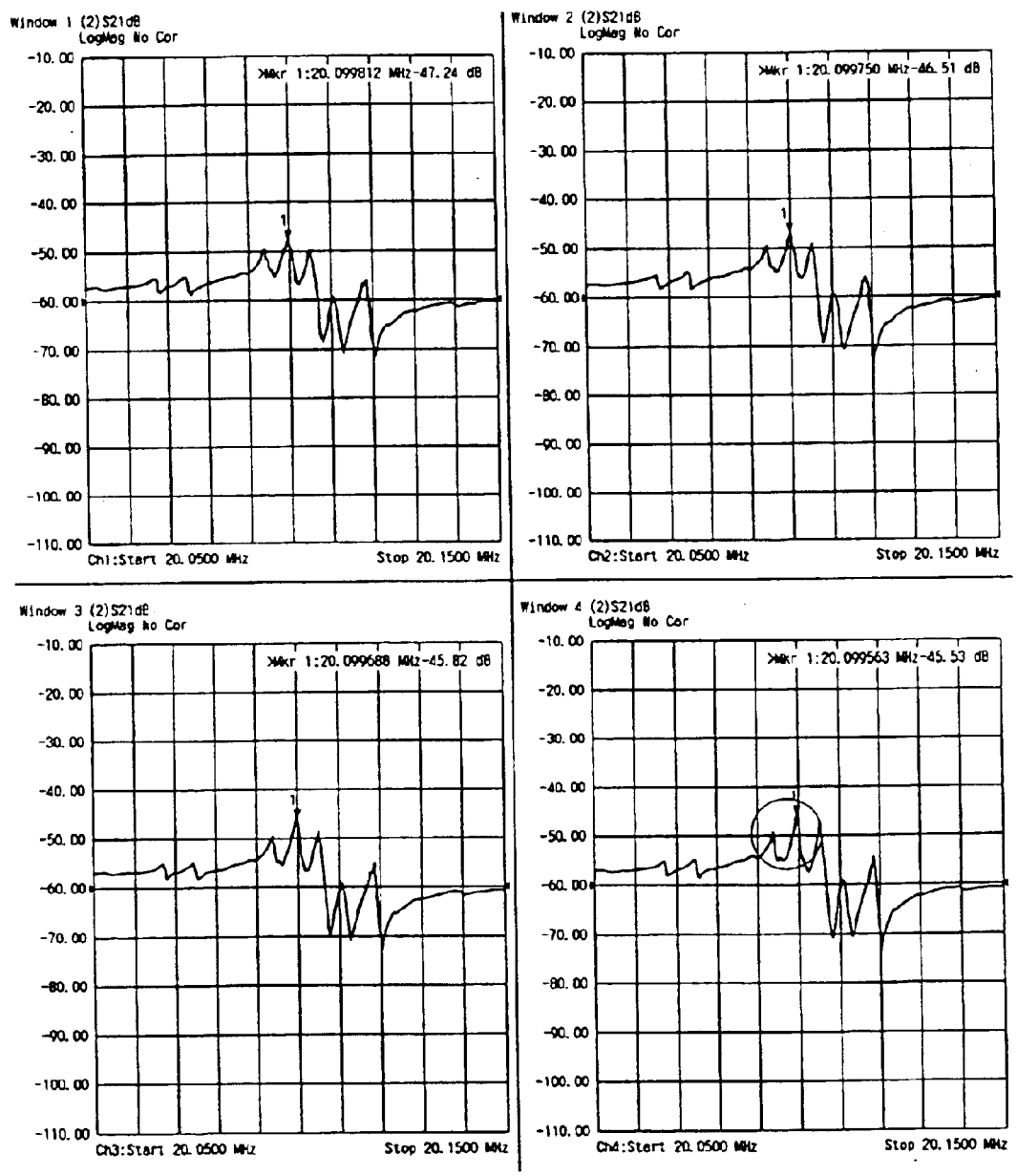
FIG. 5 is a waveform diagram illustrating a third example of measurement results that were obtained by a method for testing characteristics of oscillators according to the present invention.
Figure 6:
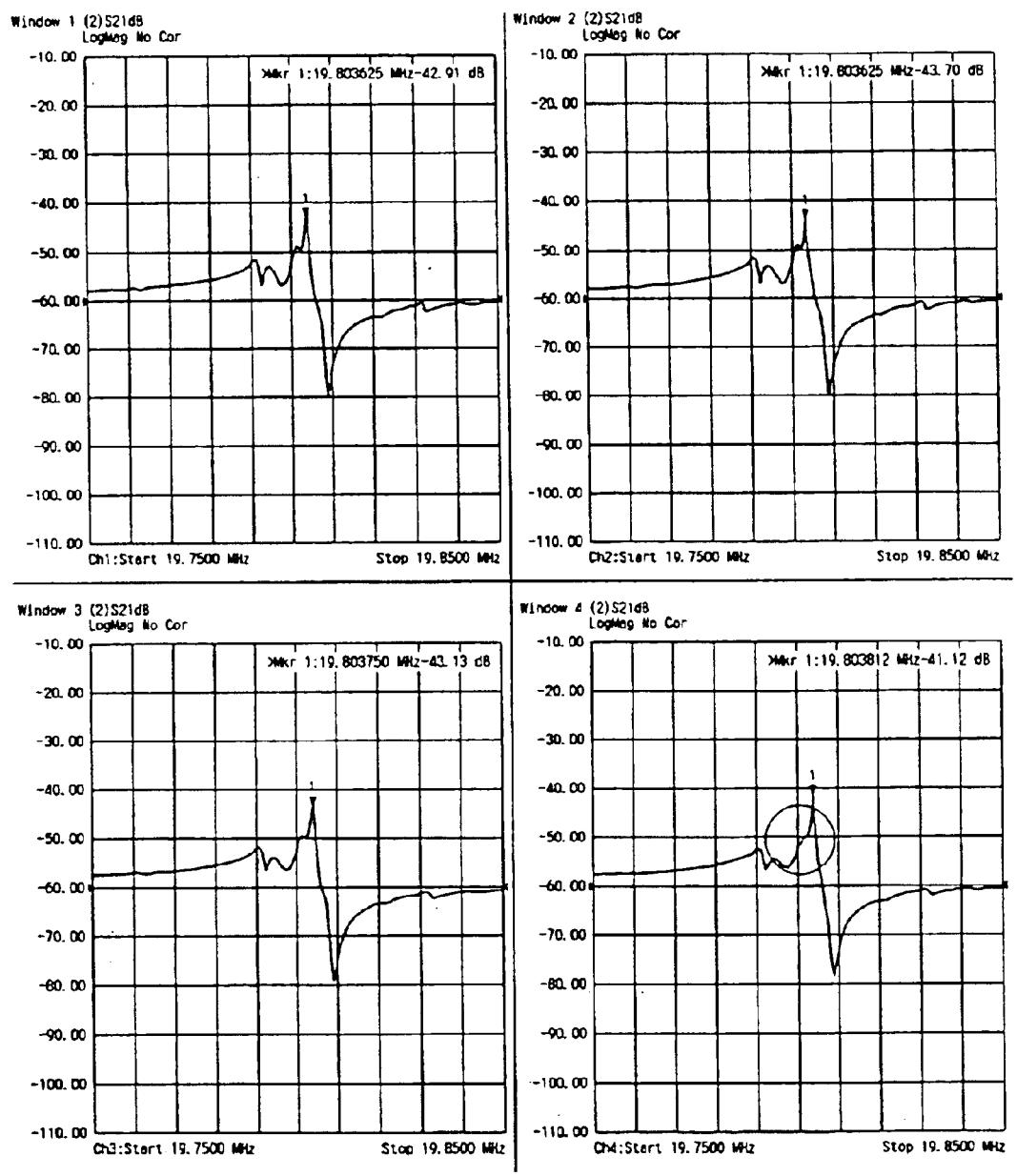
FIG. 6 is a waveform diagram illustrating a fourth example of measurement results that were obtained by a method for testing characteristics of oscillators according to the present invention.
Figure 7:
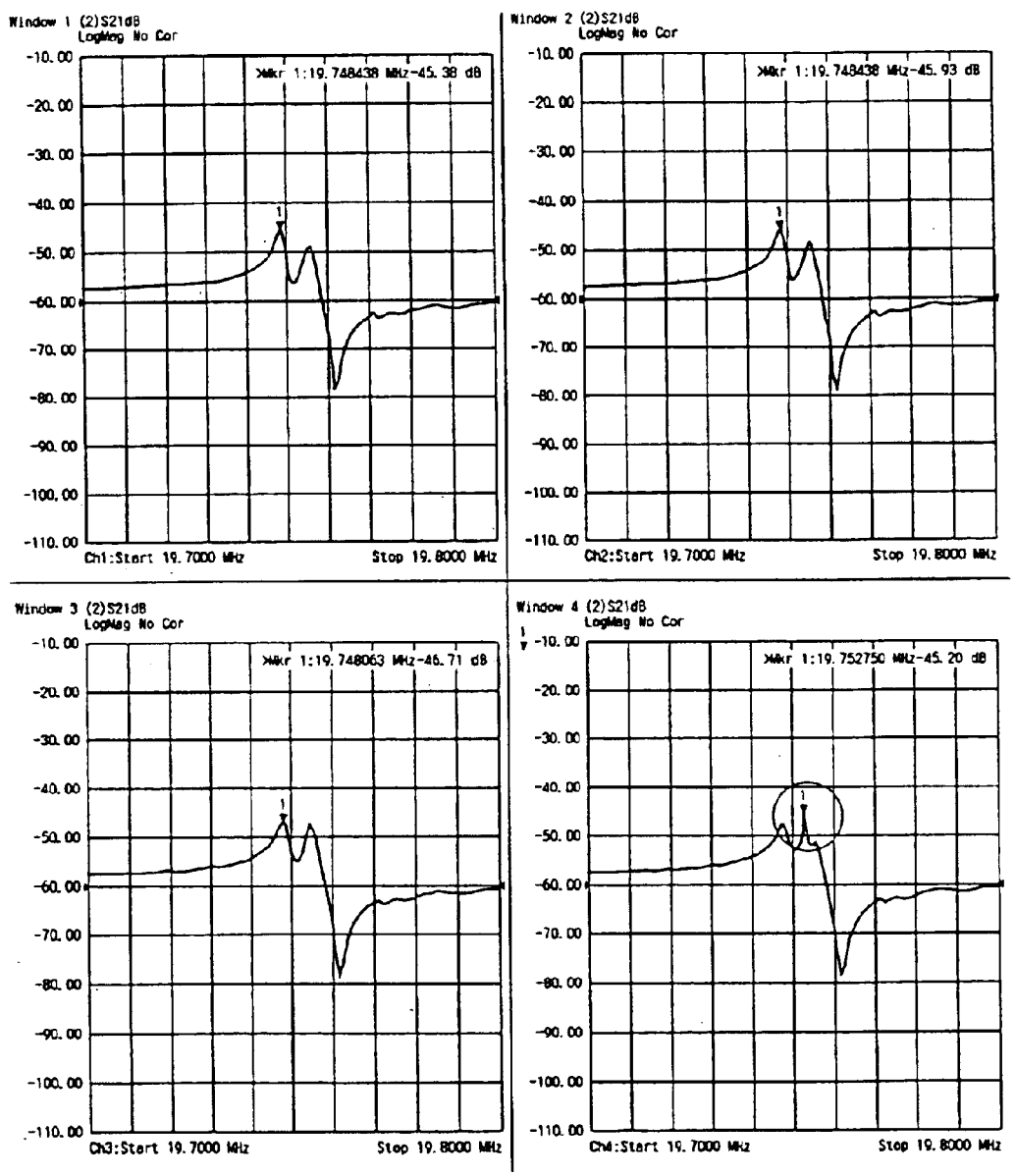
FIG. 7 is a waveform diagram illustrating a fifth example of measurement results that were obtained by a method for testing characteristics of oscillators according to the present invention.
Figure 8:
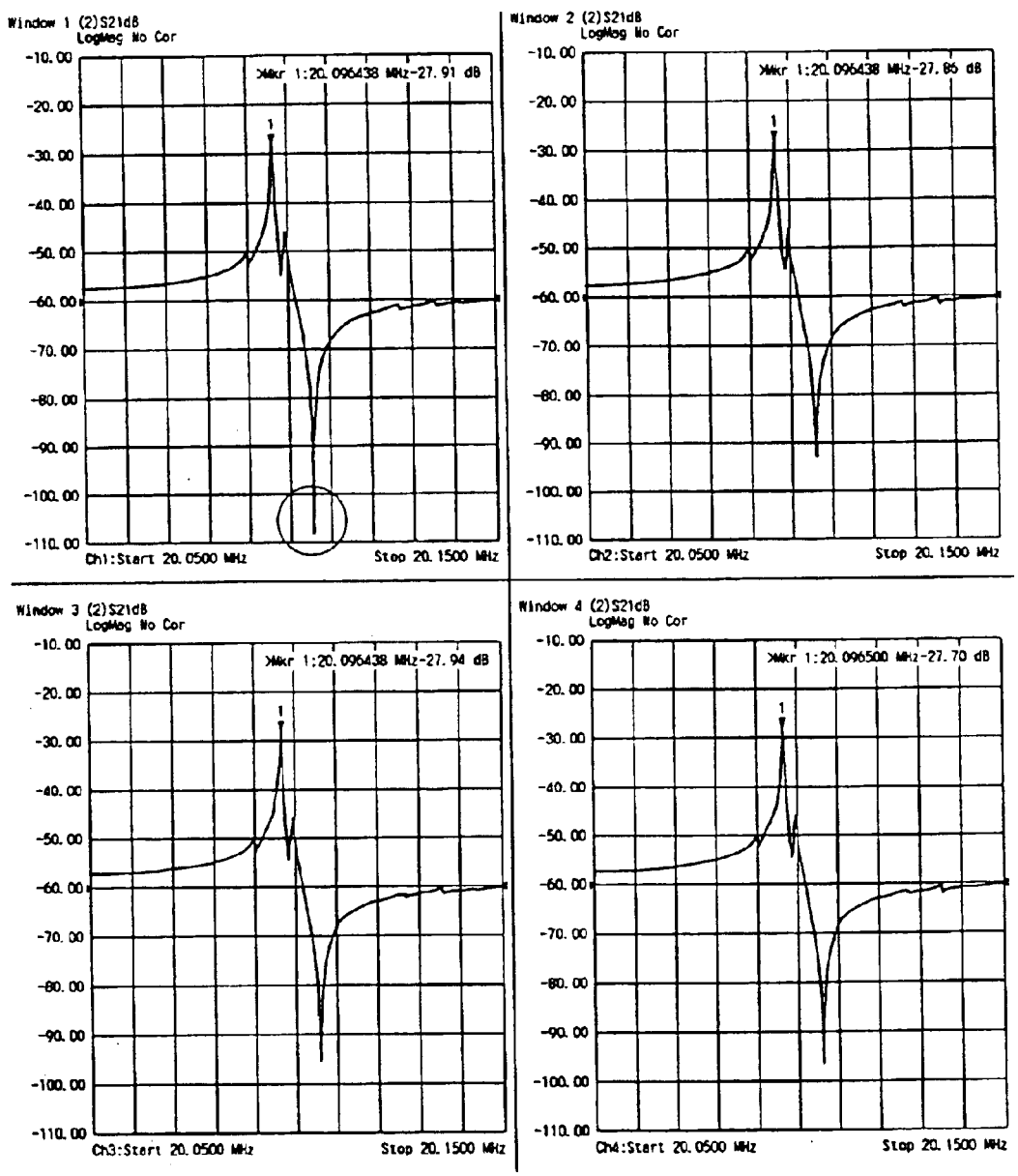
FIG. 8 is a waveform diagram illustrating a sixth example of measurement results that were obtained by a method for testing characteristics of oscillators according to the present invention.
Figure 9:
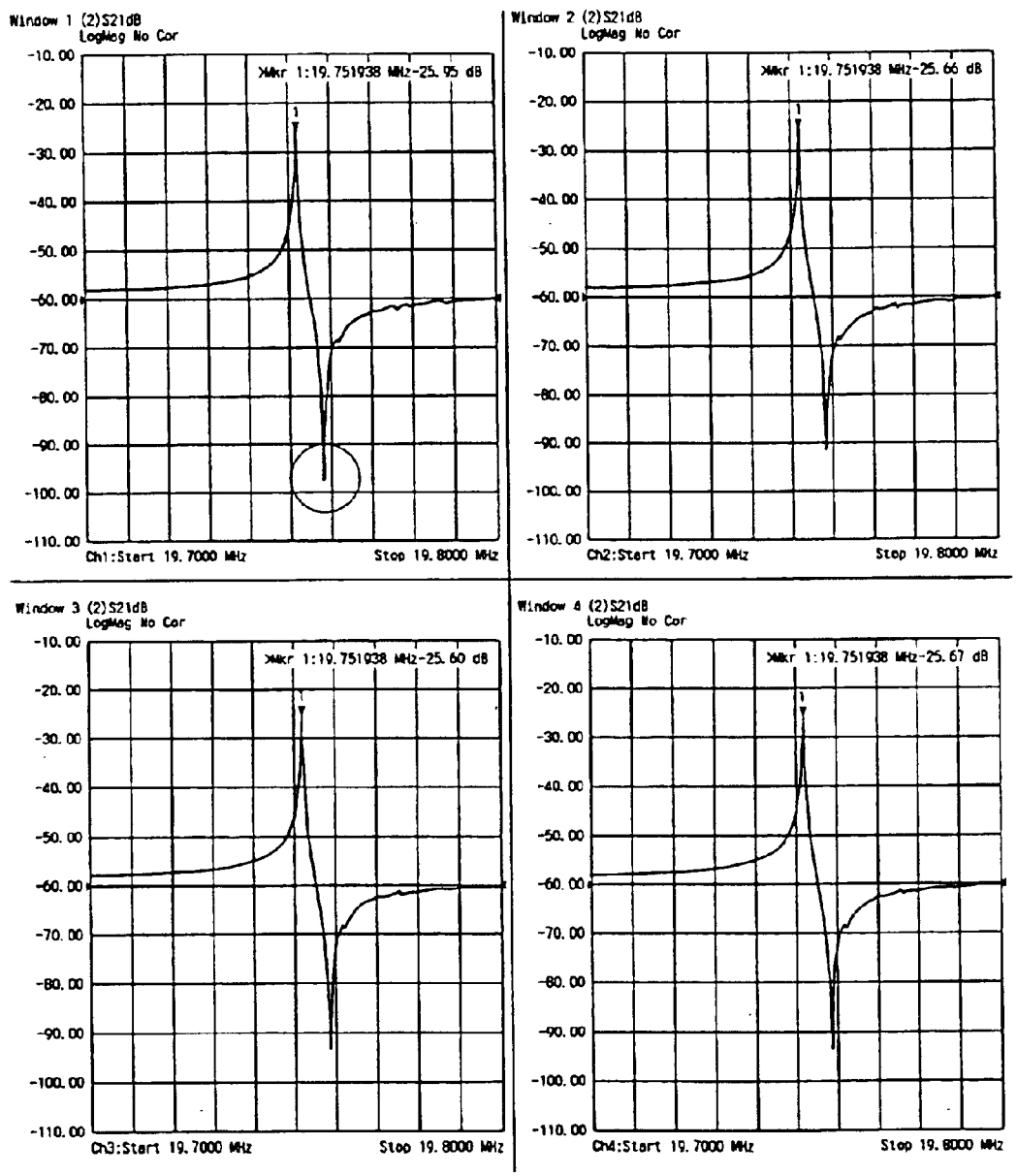
FIG. 9 is a waveform diagram illustrating a seventh example of measurement results that were obtained by a method for testing characteristics of oscillators according to the present invention.

In FIG. 4 (Data Sheet No. 32), FIG. 5 (Data Sheet No. 38), FIG. 6 (Data Sheet No. 41), and FIG. 7 (Data Sheet No. 42), only the lower right graphs (applied electrical power +10 dBm), which are surrounded by circles in each graph, are slightly different from the others. These are determined to be nonconforming items. In addition, in FIG. 8 (Data Sheet No. 33), and FIG. 9 (Data Sheet No. 50), only the upper left graphs (applied electrical power −5 dBm), which are surrounded by circles in each graph, are slightly different from the others. Thus, these are also determined to be nonconforming items.

The photographs of actual oscillator chips from which the abovementioned waveforms were obtained are shown in FIGS. 10 to 16. The photographs of the oscillator chips were taken while mounted on a black background screen.

Figure 10:
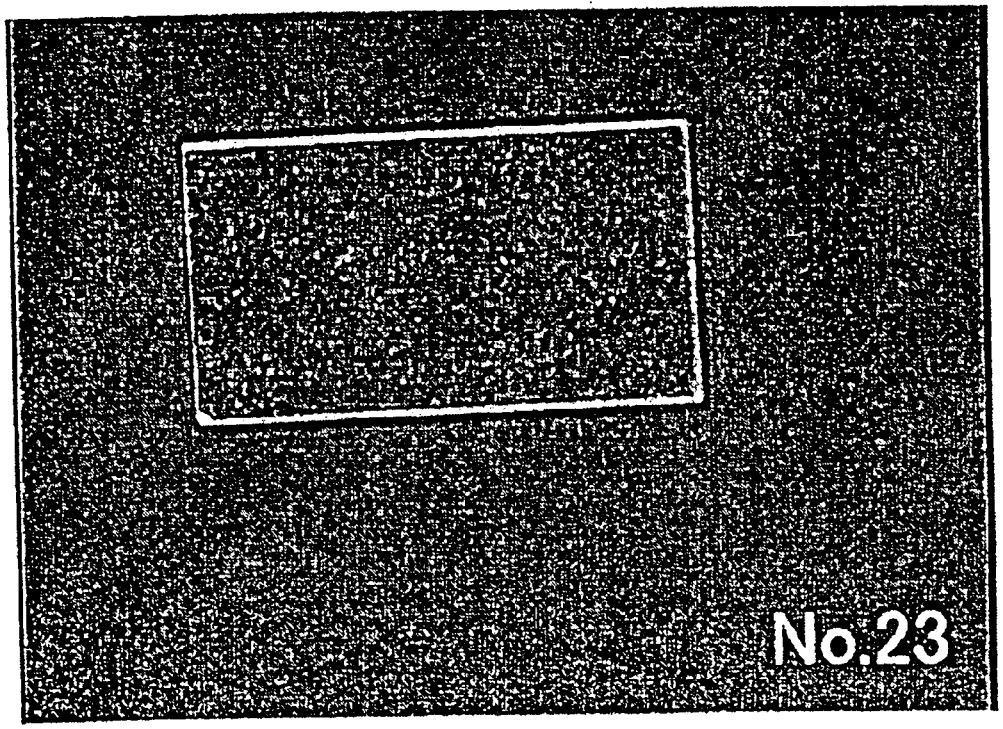
FIG. 10 is a photograph showing a surface state of an oscillator chip whose data were obtained in FIG. 3.
Figure 11:
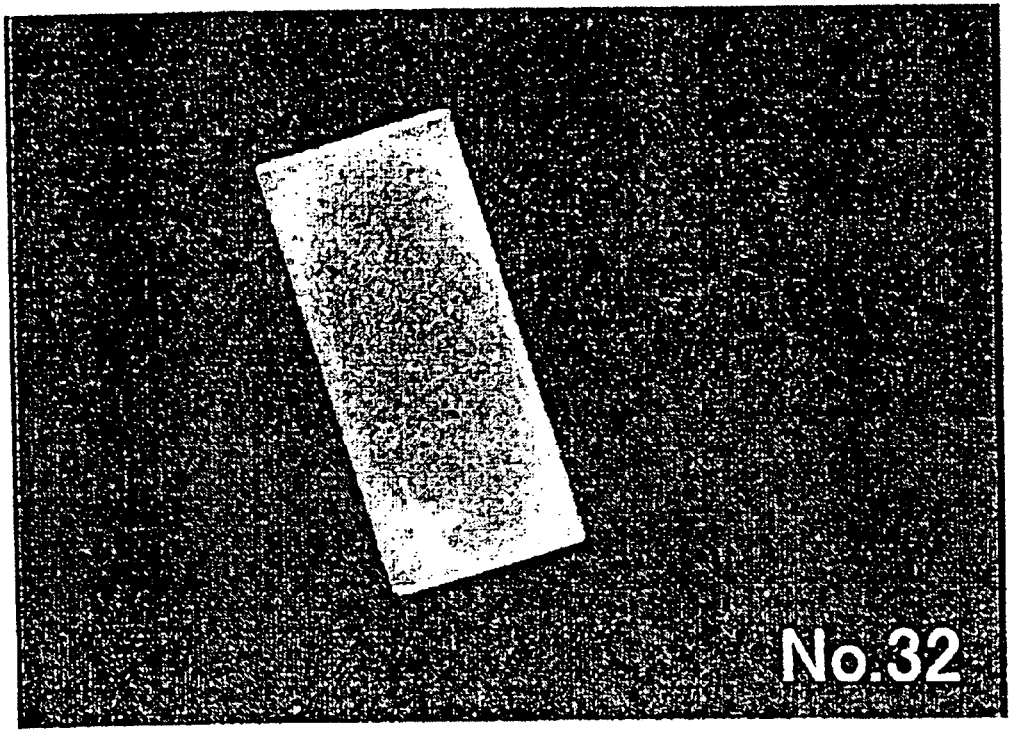
FIG. 11 is a photograph showing a surface state of an oscillator chip whose data were obtained in FIG. 4.
Figure 12:
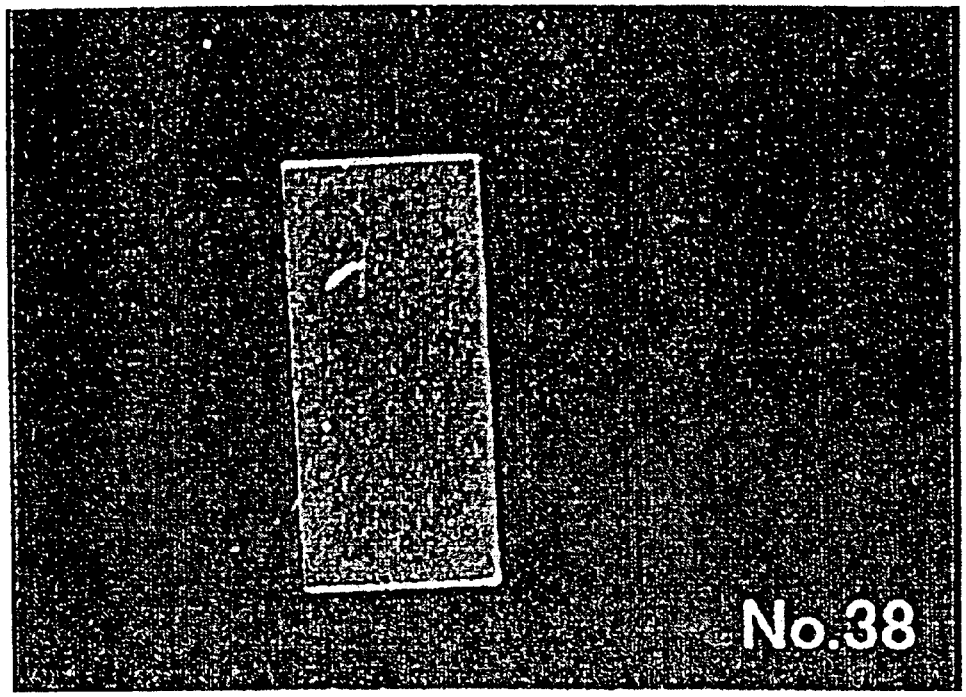
FIG. 12 is a photograph showing a surface state of an oscillator chip whose data were obtained in FIG. 5.

FIG. 10 (Data Sheet No. 23) shows a conforming item, where neither flaws nor tarnishing can be observed at all. For any of FIG. 11 (Data Sheet No. 32), FIG. 12 (Data Sheet No.

Figure 13:
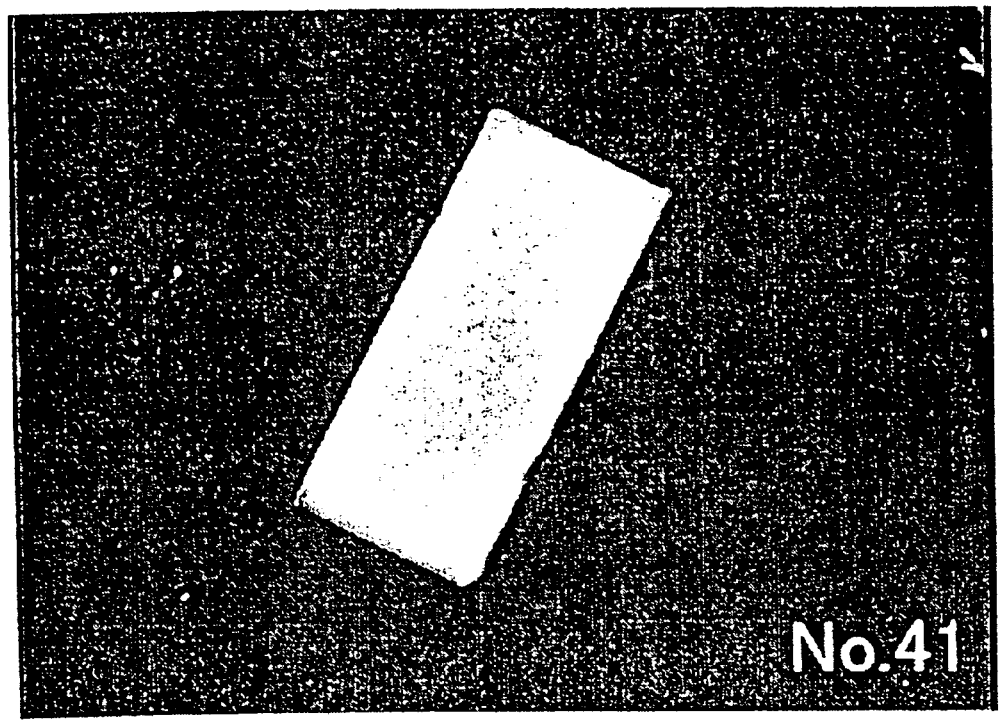
FIG. 13 is a photograph showing a surface state of an oscillator chip whose data were obtained in FIG. 6.
Figure 14:
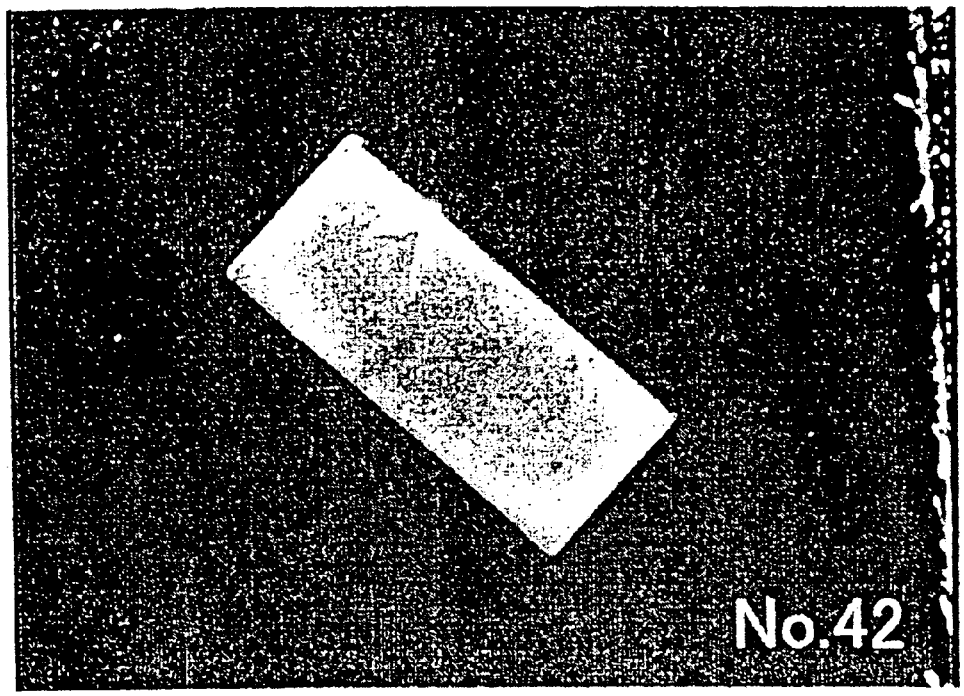
FIG. 14 is a photograph showing a surface state of an oscillator chip whose data were obtained in FIG. 7.

38), FIG. 13 (Data Sheet No. 41), and FIG. 14 (Data Sheet No. 42), only the case where the applied electrical power is +10 dBm is different from the others, but large flaws often develop from the edge to the vicinity of the center. It is noted that FIG. 13 shows the existence of a slight chip on the lower right corner of the oscillator.

Figure 15:
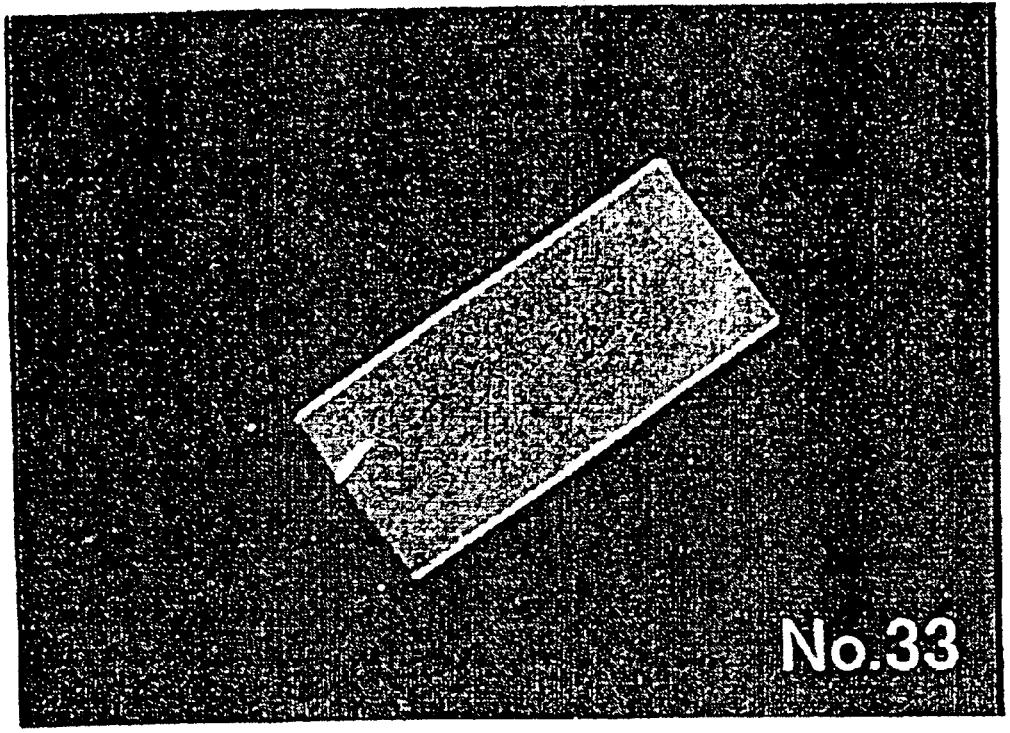
FIG. 15 is a photograph showing a surface state of an oscillator chip whose data were obtained in FIG. 8.
Figure 16:
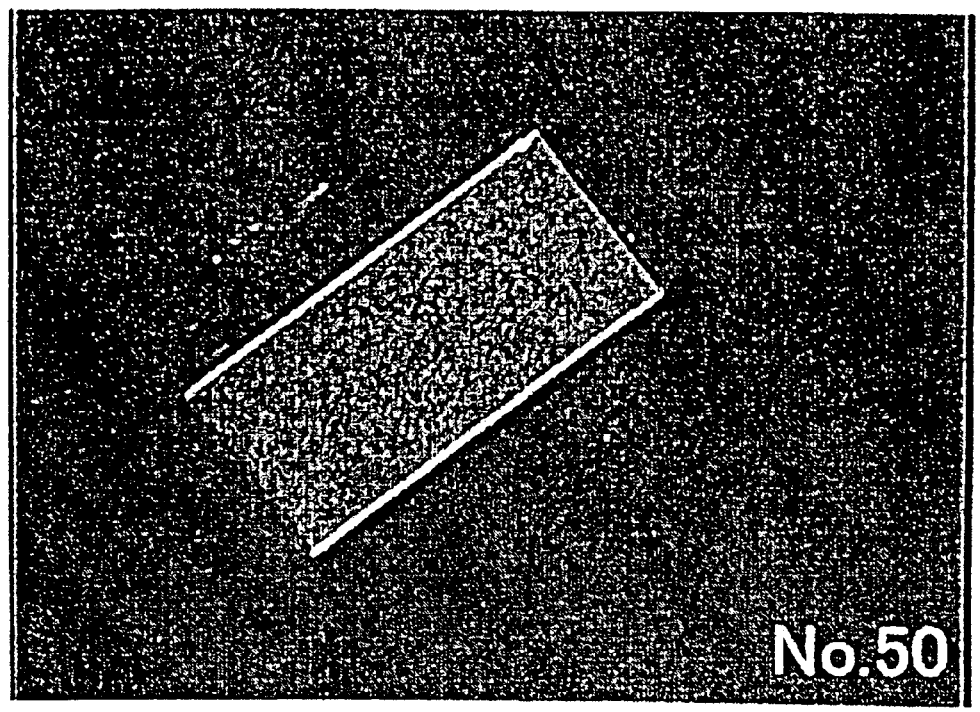
FIG. 16 is a photograph showing a surface state of an oscillator chip whose data were obtained in FIG. 9.

Also, FIG. 15 (Data Sheet No. 33) and FIG. 16 (Data Sheet No. 50) show that only the cases where the electrical power is −5 dBm have different waveforms from the others, as described above, and it is obtained as experimental data that the periphery often becomes chipped in this way. In particular, as in FIG. 16 (Data Sheet No. 50), even the ones that are slightly chipped (on a position slightly down the left-hand side from the upper left corner of the oscillator) on the periphery are successfully detected, which demonstrates the usefulness of the measurement method according to the present invention.

As described up to this point, in the foregoing examples, although the applied electrical power was changed four times and the corresponding measurement results were compared, the invention is not limited to this: only two times or five times or more may also be acceptable. Further, although the network analyzer was used as a signal source and signal detection means, the invention is not limited to this. A discrete signal source designed for variable frequency and output amplitude, a high-frequency power meter, or similar detection devices may also be used. In the foregoing examples, an external personal computer was used as memory means, but use of a network analyzer or the like in which measured data can be stored internally would also achieve the object of the invention, even if an external personal computer is not used.

Also, a bush was used as transfer means for the oscillator chips, but the invention is not limited to this. A method for transferring them by allowing them to be sucked to a sucker, a method for allowing them fall by gravitational force, and various other methods may be used, as long as the transfer means is capable of loading and unloading oscillator chips between the electrodes, and sorting conforming items and nonconforming items.

As described above, use of a measurement method according to the present invention would enable efficient detection of cracks and chips in oscillator chips, which may affect the oscillation characteristics, without using an optical examination device and an image processing device, which require troublesome adjustment and higher cost. In this measurement method, the aforementioned object can be fulfilled simply by using a network analyzer, which commonly used in oscillator testing, and measurements can be performed at low cost and at high speed.

What is claimed is:

1. A method for testing oscillators comprising:
   (a) applying test signals from a signal source to an oscillator with a pair of test electrodes a plurality of times at a common frequency, but at different amplitude levels;
   (b) measuring output signals resulting from electric current flow through the oscillator or a level of the test signals passing through said oscillator with means for measuring;
   (c) storing the output signals measured by the measurement means in memory means for storing; and
   (d) comparing the output signals to determine if the output signals conform with one another.

2. The method according to claim 1, wherein the method further comprises forming a network analyzer with at least one of the signal source and the measurement means.

3. The method according to claim 1, wherein the applying step includes positioning one of the pair of test electrodes at a position above the oscillator and the other one of the pair of test electrodes at a position below the oscillator, and then moving the electrodes toward one another with a vertical driving mechanism to contact the oscillator.

4. The method according to claim 1, wherein the applying step includes applying a frequency in a range of 19.70 MHz to 20.15 MHz.

5. The method according to claim 1, wherein the applying step includes applying four different voltage levels.

* * * * *